United States Patent
Ke et al.

(10) Patent No.: US 7,394,136 B2
(45) Date of Patent: Jul. 1, 2008

(54) HIGH PERFORMANCE SEMICONDUCTOR DEVICES FABRICATED WITH STRAIN-INDUCED PROCESSES AND METHODS FOR MAKING SAME

(75) Inventors: Chung-Hu Ke, Taipei (TW); Wen-Chin Lee, Hsin-Chu (TW); Yee-Chia Yeo, Singapore (SG); Chih-Hsin Ko, Fongshan (TW); Chenming Hu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/194,084

(22) Filed: Jul. 29, 2005

(65) Prior Publication Data

US 2005/0263828 A1 Dec. 1, 2005

Related U.S. Application Data

(62) Division of application No. 10/683,901, filed on Oct. 10, 2003, now Pat. No. 6,949,443.

(51) Int. Cl.
*H01L 21/00* (2006.01)
(52) U.S. Cl. .................... 257/374; 257/373
(58) Field of Classification Search .......... 438/373–374
See application file for complete search history.

(56) References Cited

U.S. PATENT DOCUMENTS

| | | | | |
|---|---|---|---|---|
| 3,355,637 A | * | 11/1967 | Johnson | 257/192 |
| 4,912,355 A | * | 3/1990 | Noel et al. | 310/311 |
| 5,190,831 A | * | 3/1993 | Banker | 428/660 |
| 5,602,418 A | * | 2/1997 | Imai et al. | 257/627 |
| 6,221,733 B1 | | 4/2001 | Li et al. | 438/424 |
| 6,225,154 B1 | * | 5/2001 | Allman | 438/231 |
| 6,261,931 B1 | * | 7/2001 | Keller et al. | 438/492 |
| 6,309,942 B1 | | 10/2001 | Tsui et al. | 438/400 |
| 6,429,136 B2 | | 8/2002 | Miwa | 438/692 |
| 6,488,771 B1 | * | 12/2002 | Powell et al. | 117/89 |
| 6,570,221 B1 | * | 5/2003 | Allman | 257/347 |
| 6,649,277 B1 | * | 11/2003 | Lee et al. | 428/611 |

(Continued)

OTHER PUBLICATIONS

Steegen et al, "Silicide Induced pattern Density and Orientation Dependent Transconductance in MOS Transistors," 1999 IEEE, IEDM 99, pp. 497-500.

(Continued)

*Primary Examiner*—Laura M Schillinger
(74) *Attorney, Agent, or Firm*—Duane Morris LLP

(57) ABSTRACT

A high performance semiconductor device and the method for making same is disclosed with an improved drive current. The semiconductor device has source and drain regions built on an active region, a length of the device being different than a width thereof. One or more isolation regions are fabricated surrounding the active region, the isolation regions are then filled with an predetermined isolation material whose volume shrinkage exceeds 0.5% after an anneal process. A gate electrode is formed over the active region, and one or more dielectric spacers are made next to the gate electrode. Then, a contact etch stopper layer is put over the device, wherein the isolation regions, spacers and contact etch layer contribute to modulating a net strain imposed on the active region so as to improve the drive current.

1 Claim, 10 Drawing Sheets

U.S. PATENT DOCUMENTS

| | | | |
|---|---|---|---|
| 6,853,519 B2 * | 2/2005 | Parker et al. | 360/322 |
| 6,869,866 B1 * | 3/2005 | Chidambarrao et al. | 438/581 |
| 6,890,808 B2 * | 5/2005 | Chidambarrao et al. | 438/199 |
| 6,906,360 B2 * | 6/2005 | Chen et al. | 257/204 |
| 6,944,922 B2 * | 9/2005 | Shearer et al. | 29/25.35 |
| 6,949,443 B2 * | 9/2005 | Ke et al. | 438/400 |
| 6,951,819 B2 * | 10/2005 | Iles et al. | 438/705 |
| 6,979,627 B2 * | 12/2005 | Yeap et al. | 438/424 |
| 7,091,563 B2 * | 8/2006 | Chidambarrao et al. | 257/369 |
| 2004/0061415 A1 * | 4/2004 | Shearer et al. | 310/311 |
| 2004/0075954 A1 * | 4/2004 | Parker et al. | 360/322 |
| 2004/0166681 A1 * | 8/2004 | Iles et al. | 438/689 |
| 2004/0258963 A1 * | 12/2004 | Nolan | 428/694 TS |
| 2005/0051851 A1 * | 3/2005 | Chen et al. | 257/369 |
| 2005/0079677 A1 * | 4/2005 | Ke et al. | 438/296 |
| 2005/0099099 A1 * | 5/2005 | Shearer et al. | 310/363 |
| 2005/0120546 A1 * | 6/2005 | Parker et al. | 29/603.07 |
| 2005/0136606 A1 * | 6/2005 | Rulke et al. | 438/305 |
| 2005/0148133 A1 * | 7/2005 | Chen et al. | 438/199 |
| 2005/0242403 A1 * | 11/2005 | Yeap et al. | 257/374 |
| 2005/0263828 A1 * | 12/2005 | Ke et al. | 257/374 |
| 2005/0269900 A1 * | 12/2005 | Shearer et al. | 310/311 |
| 2006/0057418 A1 * | 3/2006 | Fairbourn | 428/623 |
| 2006/0121688 A1 * | 6/2006 | Ko et al. | 438/439 |
| 2006/0174815 A1 * | 8/2006 | Butcher et al. | 117/2 |
| 2006/0186470 A1 * | 8/2006 | Chen et al. | 257/344 |

OTHER PUBLICATIONS

Bufler et al., "Hole and Electron Transport in Strained Si: Orthorhombic Versus Biaxial Tensile Strain," Applied Physics Letters, vol. 81, No. 1, Jul. 1, 2002, pp. 82-84.

Dombrowski et al., "Determination Of Stress in Shallow Trench Isolation For Deep Submicron MOS Devices By UV Raman Spectroscopy," 1999 IEEE, IEDM 99, pp. 357-360.

Scott et al., "NMOS Drive Current Reduction Caused By Transisitor Layout and Trench Isolation Induced Stress," 1999 IEEE, IEDM 99, pp. 827-830.

IBM's Strained Silicon Breakthrough Image, pp. 1-2, cited at http://www.research.ibm.com/resources/press/strainedsilicon/dated Apr. 8, 2003.

C.K. Maiti et al., "Applications of Silicon-Germanium Heterostructure Devices", Institute of Physics Publishing, Chapter 2, pp. 32-72, 2001.

Yukihiro Kumagai et al., "Evaluation of change in drain current due to strain in 0.13-um-node MOSFETs", Extended Abstracts of the 2002 International Conference on Solid State Devices and Materials. pp. 14-15. 2002.

* cited by examiner

| Strain Field | Desired Strain Change | |
| --- | --- | --- |
| | NMOS FET | PMOS FET |
| $\Delta\varepsilon_x$ | + | - |
| $\Delta\varepsilon_y$ | + | + |
| $\Delta\varepsilon_z$ | - | + |

+ = more tensile, less compressive
− = less tensile, more compressive

Fig. 2

HIGH PERFORMANCE SEMICONDUCTOR DEVICES FABRICATED WITH STRAIN-INDUCED PROCESSES AND METHODS FOR MAKING SAME

RELATED APPLICATION

This application is a divisional application of U.S. application Ser. No. 10/683,901, filed Oct. 10, 2003, now issued as U.S. Pat. No. 6,949,443 B2, the contents of which are herein incorporated by reference as if set forth in their entirety and upon which priority is claimed.

BACKGROUND

The present disclosure relates to the fabrication of high performance field-effect transistors in CMOS integrated circuits, and more particularly, relates to methods for integrating and modulating the strain-induced process steps to enhance the transistors' performance and the semiconductor devices so formed.

Very large scale integrated (VLSI) circuits using field effect transistors (FET) experience problems with the strain or mechanical stress induced by the silicon and/or silicon-germanium substrate's lattice mismatch created by certain process steps during device fabrication. The strain induced upon the transistors' gate electrical channel affect the transistors' electrical field strength and carrier mobility performance. In complimentary metal oxide semiconductor (CMOS) devices, strain effect can be an especially difficult issue to deal with because the devices comprise of different transistor types. The affects of various strain magnitudes and strain directions upon a given transistor size and orientation have varying affects upon different transistor types. For example, tensile stress/strain applied in the direction parallel to the gate channel of an n-channel MOS transistor will provide improved drive current (Id) performance, while the same stress applied upon an identical sized and oriented p-channel transistor will cause degraded Id performance. As transistor geometric sizing and distances scale down, strain/stress affects applied upon the MOS transistors become relatively more strong and difficult to overcome.

Strain-inducing process operations are numerous in the fabrication flow of CMOS devices. One critical process loop for example, the shallow trench isolation (STI) fabrication, involves the construction of a substrate structure to isolate and define the transistors' active regions. The STI process loop of trench etching, trench filling, planarization and annealing results with a completed STI structure inducing stress onto the transistors from at least two axial (biaxial) directions. Processes that do not directly modify the substrate may also apply additional strain upon the transistor. Such processes create structures such as the sidewall spacers and contact etch stop (CES) layer, films that are deposited or grown on top of and/or adjacent to the transistor gates. Other strain inducing processes such as the metal silicidation processes involve the reaction of dissimilar materials to form new layers near the gate channel.

FIG. 1 illustrates a cross-sectional view of a conventional field-effect transistor 100 showing the basic components thereof with some of the above-mentioned strain inducing structures. The figure also has been labeled with three axis to show the three directions of how strain fields are applied with respect to the FET orientation. The substrate 101 area located between STI structures 102a and 102b is the defined transistor active region. The gate region comprising of a gate oxide 103 and gate electrode 104 is fabricated within this active region. Gate sidewall liners 105 and gate sidewall spacers 106a and 106b are situated adjacent to the gate region. The gate electrical channel shown as distance g is defined as the region of the substrate surface under the gate region, between the source (distance s) and drain (distance d) substrate regions of the transistor. The source s and drain d regions extend out from the ends of the gate channel to the STI structures. Metal-silicided electrodes areas are formed on top of the transistor's gate, source and drain regions. These regions are shown in FIG. 1 as gate silicide 107, source silicide 108 and drain silicide 109 regions. The contact etch stop (CES) 110 layer is shown, situated on top of the entire transistor at the process point just prior to the contact masking/patterning operations of the device.

The strain/stress forces are specified by the three dimensional axis x, y and z. For the discussions within the present disclosure, the axis parallel to the gate channel across the substrate along the direct path to and from the source and drain regions is known as the x direction, as shown in FIG. 1. The strain axis perpendicular to the gate channel across the substrate is known as the y direction. The third axis z is the strain direction directly normal to the substrate surface and to the plane created by axis x and y. It is noted that the various fabricated transistor structures shown in FIG. 1 will apply a variety of strain forces onto the transistor's gate channel in various magnitudes and directions. In the conventional CMOS technologies, the two-component x-y biaxial strain from the STI structures is a large portion of the net effect.

Accordingly, it is desirable to have a method for modulating the net strain induced by the various device fabrication processes/structures. An engineering and design method is desired for specifically modulating strain in certain preferential magnitudes and axial directions to allow for the simultaneous improvement of both NMOS and PMOS transistors.

SUMMARY

A high performance semiconductor device and the method for making same is disclosed with an improved drive current. The semiconductor device has source and drain regions built on an active region, a length of the device being different than a width thereof. One or more isolation regions are fabricated surrounding the active region, the isolation regions are then filled with an predetermined isolation material whose volume shrinkage exceeds 0.5% after an anneal process. A gate electrode is formed over the active region, and one or more dielectric spacers are made next to the gate electrode. Then, a contact etch stopper layer is put over the device, wherein the isolation regions, spacers and contact etch layer contribute to modulating a net strain imposed on the active region so as to improve the drive current These and other aspects and advantages will become apparent from the following detailed description, taken in conjunction with the accompanying drawings, illustrating by way of example the principles of the disclosure.

BRIEF DESCRIPTION OF THE DRAWINGS

FIG. 2 is a table illustrating the relationship of strain field change along three directional axis for transistor Id improvement on NMOS and PMOS FETs.

DESCRIPTION

The present disclosure describes a method for the simultaneous improvement of both NMOS and PMOS transistors' performance used in CMOS circuits by the modulation of strain contributions from common integrated circuit fabrication processes.

FIG. 2 is a table that illustrates the effects upon the gate channels of NMOS and PMOS FET transistors due to the change in the strain field (☐☐) for each of the three strain axial directions. The symbols "+" and "−" annotate the change in strain, for a given direction, required to improve the Id performance of each transistor type. The + symbol denotes that tensile strain/stress increase (less compressive strain) is desired for Id improvement, while the − symbol specifies that a tensile strain reduction (more compressive strain) is desired. The interrelationships between the strain magnitude and strain directions shown in this table summarizes the complexity and difficulty for the simultaneous improvement of performance for both n-channel and p-channel MOS transistors. The relationships show that the NMOS FET performance improves with increased tensile strain in the x-y biaxial plane. Simultaneous PMOS FET improvement can be achieved with added tensile strain field from the normal Z direction. The added third strain component to the biaxial plane, an anisotropic in-plane tensile strain increase to the overall transistor gate channel, will improve performance of the PMOS transistors at a relatively small expense to the net performance gain already realized on the NMOS transistors.

Figure 1:
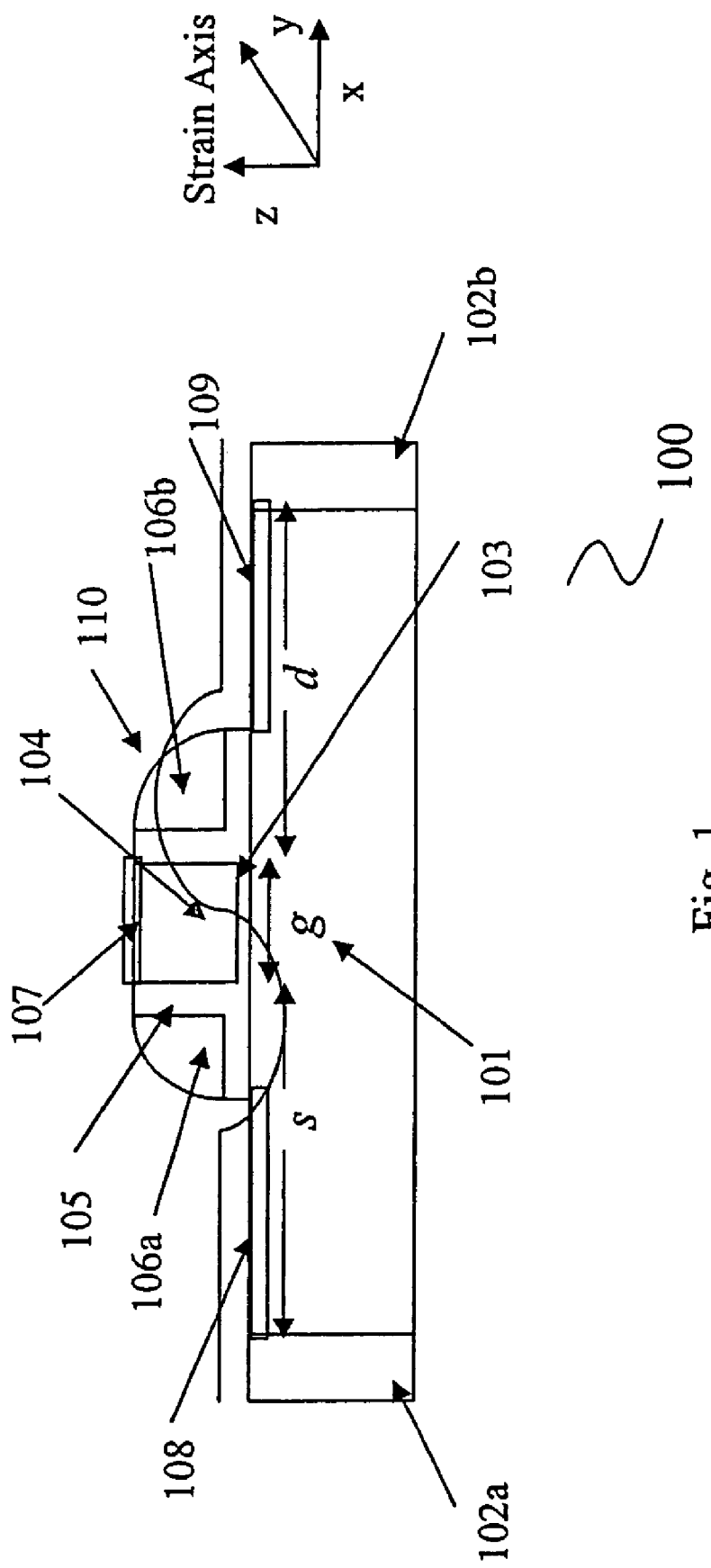
FIG. 1 illustrates a cross-sectional side view of a metal-oxide-silicon field-effect transistor (MOSFET) produced by conventional methods.
Figure 3:
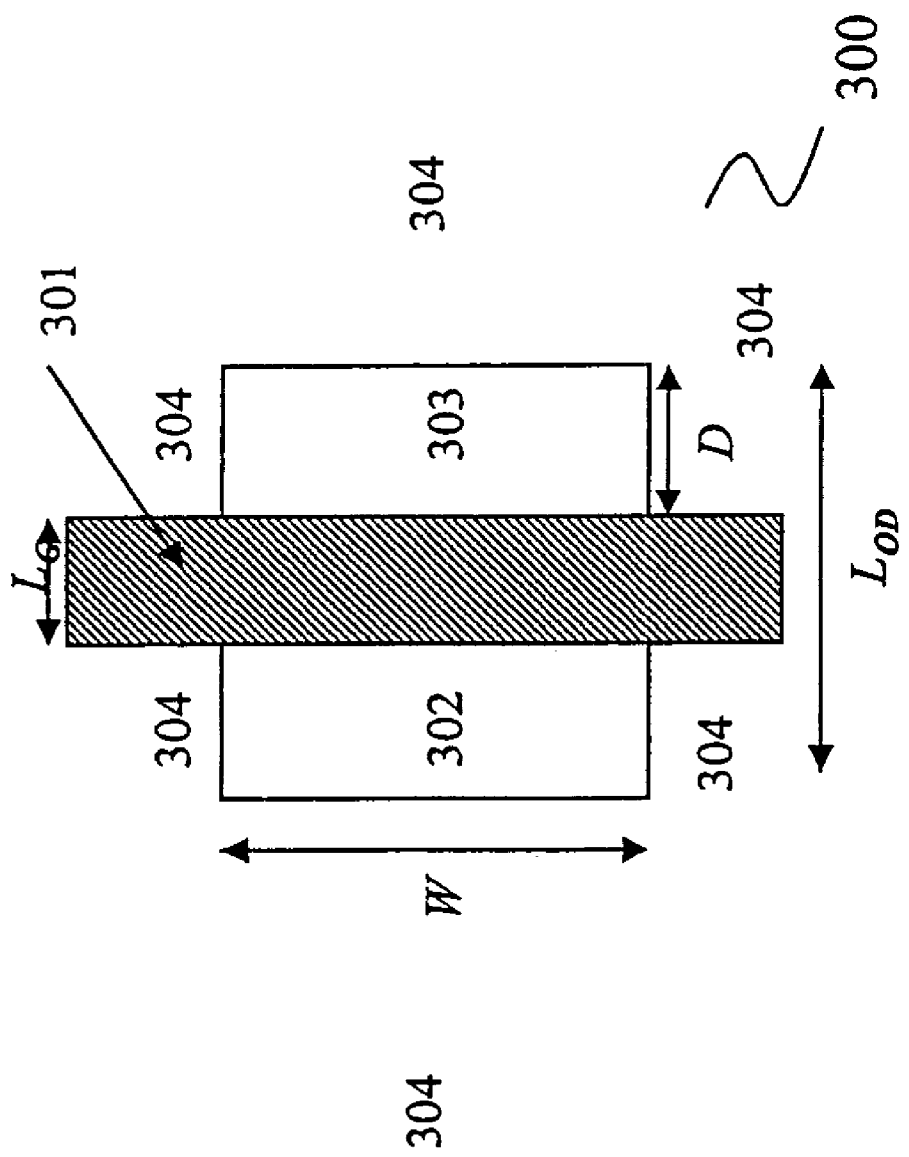
FIG. 3 illustrates a top planar view of a MOSFET showing the length of the transistor's active region to be less than the width.

Referring now to FIG. 3, there is shown a top planar view of a common MOS field-effect transistor 300 at the process step after the completion of the transistor's metal silicidation processes to illustrate one example for modulating strain by defining the shallow trench isolation (STI) structure dimensions. The transistor's gate electrode 301 is shown with the source 302 and drain 303 regions situated adjacent to the gate. The STI regions 304 for confining the transistor's active region are shown located around the transistor. The active region of the transistor bound by the STI structures is dimensionally defined within FIG. 3 by the distance $L_{OD}$, length of the region aligned with the x strain axis along the gate channel, extending from the outer end of the source and ending at the outer end of the drain areas. Distance W is the width of the active region in the y strain axis perpendicular to the gate channel, extending from one outer end of the source or drain and ending at the other end of the source or drain. Distance D corresponds to the distance from the transistor gate electrode to the outer end of the source or drain regions in the direction that aligns with the x strain direction. Distance $L_G$ corresponds to and aligns in the x strain direction with the transistor's gate channel. In this transistor example the active region is rectangular-shaped with the width W of the STI-bound region greater than the length $L_{OD}$ of the region providing a lower magnitude of x-component than that of the y-component of the biaxial strain induced by the STI. Referring to the chart of FIG. 2, this bound active region design is most favorable for NMOS devices, and not detrimental to PMOS devices.

Figure 4:
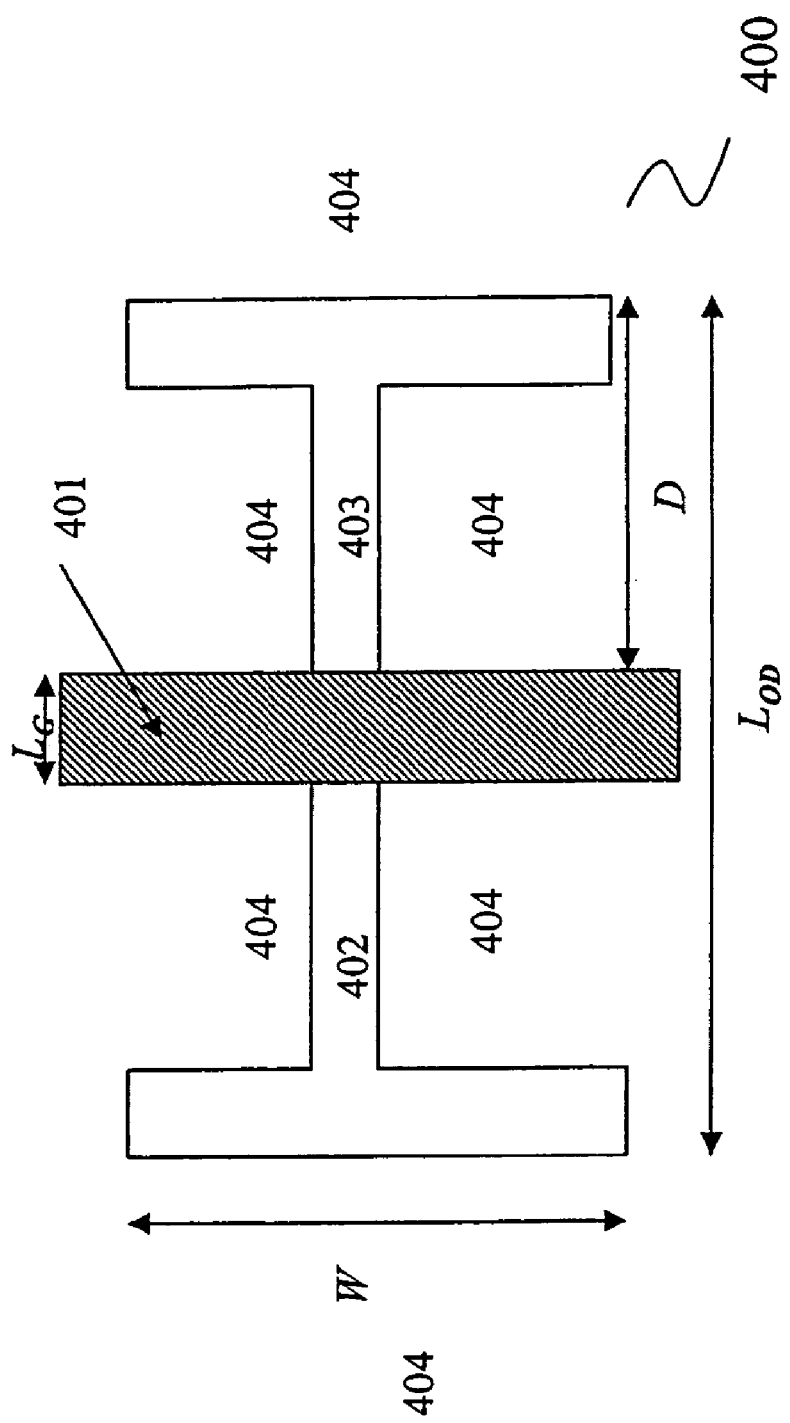
FIG. 4 illustrates a top planar view of a MOSFET showing the length of the transistor's active region to be greater than the width.

Referring now to FIG. 4, there is shown a top planar view of another MOS field-effect transistor 400 at a similar point of fabrication as the transistor in FIG. 3. The transistor 400 features the same components as those of FIG. 3, having a gate electrode 401, source 402, drain 403, and STI 404 regions illustrated. The dimensions of the above-mentioned component layout is different such that the transistor's active region bound by the STI structure is shaped as the letter "H" as opposed to the rectangular shape of FIG. 3's. The transistor example of FIG. 4 illustrates that the width W (y strain direction) of the transistor's active region is less than the length $L_{op}$ (x strain direction). However, note that the STI structures adjacent to the transistor channel have been restricted by the source and drain electrode extensions that form the left and rights sides of the "H" shape. This confinement of the STI structures effectively reduce the $L_{OD}$, x strain component down from a large magnitude, to a much smaller component appropriately corresponding to the distance D. This "H" modification of the STI dimensions provides a smaller x strain component upon the gate channel, favorable for the PMOS transistor.

Referring back to the chart of FIG. 2, different transistor region shapes for the different FET types will provide different Id performance due to the different strain forces applied. Purposeful dimensional sizing of the STI structures for each FET type allow design layouts that will help the simultaneous improvement and/or the optimal balancing of the transistors' performance. The new transistor dimension parameters $L_{OD}$ and D can be used as additional design decision parameters within conventional device modeling tools such as SPICE. It is by this methodology, that the performance enhancement of the NMOS and PMOS transistors can be accomplishment by the preferential modulation of the x-y biaxial strain applied upon the gate channel with the length, width dimensional design of the STI structures.

Figure 5B:
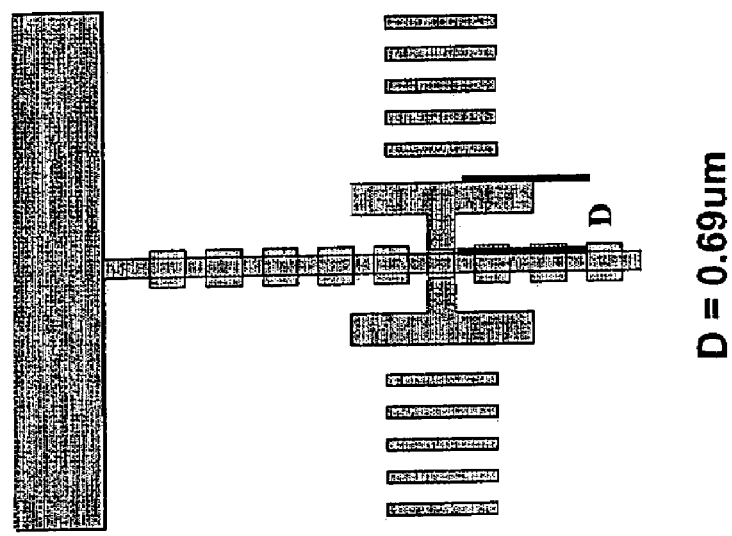
FIGS. 5A and 5B illustrate sample circuit layouts of the transistors corresponding to those in FIG. 3 and FIG. 4.
Figure 5A:
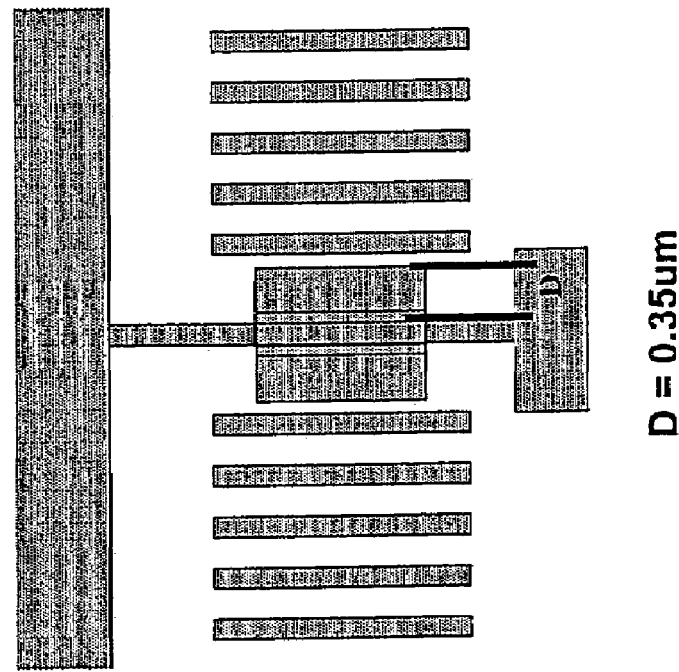

Referring now to FIGS. 5A and 5B, there are shown two detailed circuit layout examples of the transistors as described by FIGS. 3 and 4. FIG. 5A is a top planar view of a transistor corresponding to FIG. 3 with the rectangular-shaped active region. The device as shown has a width W that is greater than 0.60 micron and distance D that is 0.35 micron. FIG. 5B is a top planar view of a transistor corresponding to FIG. 4 with the "H" shaped active region. This figure has a width W that is less than or equal to 0.60 micron and distance D that is 0.69 micron. The design guideline set forth for this present embodiment is that the use of rectangular active regions are favored for width distances W greater than 0.60 micron and that "H" shaped active regions are favored for use with widths W less than or equal to 0.60 micron. It is understood that the design guideline can vary according to the need of a particular technology process.

Figures 6A, 6B:
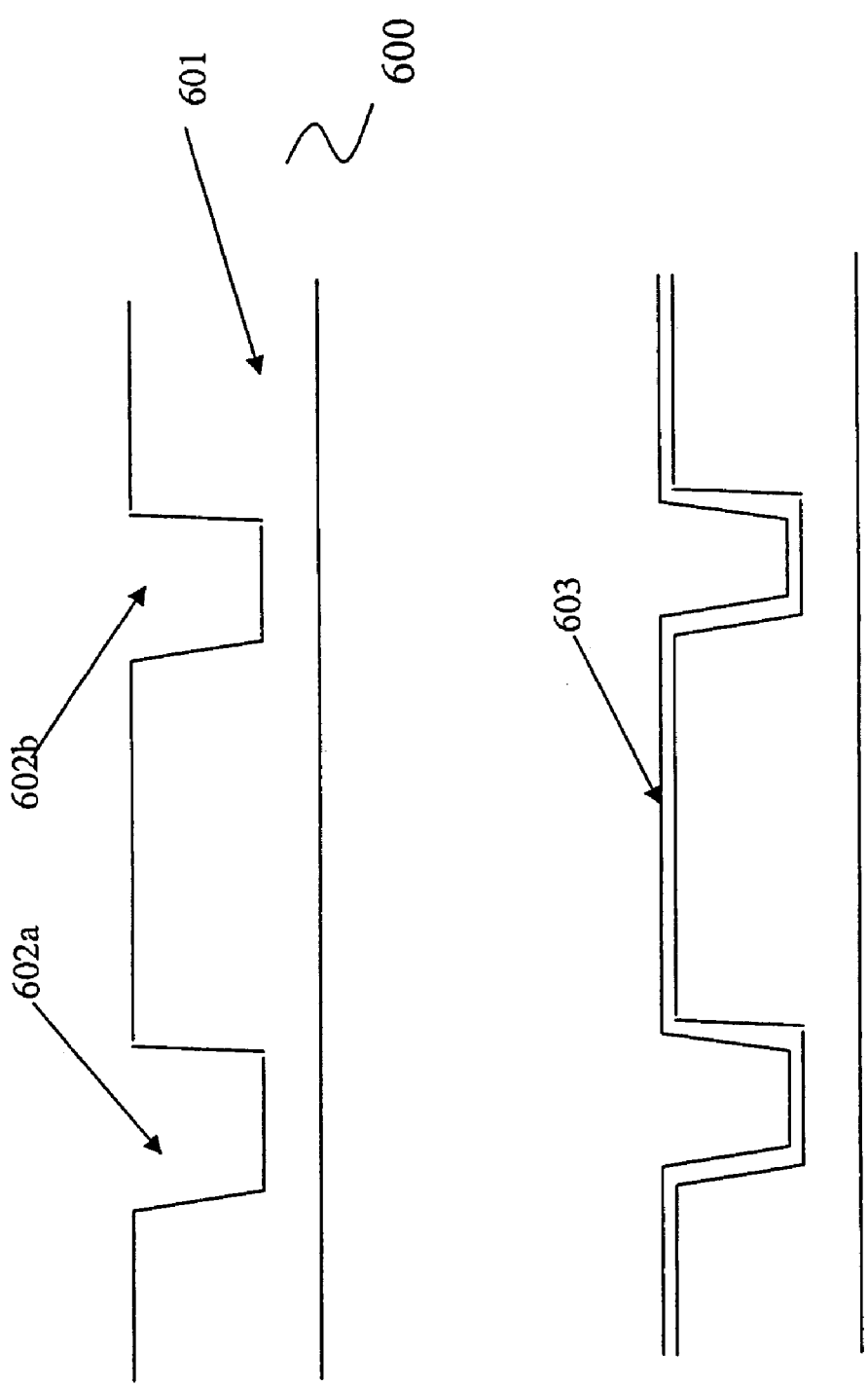
FIGS. 6A through 6D illustrate cross-sectional side views of a semiconductor substrate at certain STI fabrication steps in accordance with one example of the present disclosure.

Referring now to FIGS. 6A through 6E, there are shown cross-sectional side views of a field-effect transistor 600 during certain process steps of the STI fabrication sequence. FIG. 6A illustrates a semiconductor silicon substrate 601 shown with several isolation regions/trenches 602a-b opened from the substrate's top surface. The substrate material may be of any semiconductor typically used in the manufacture of integrated circuits. Conventional steps of photoresist masking and plasma etching of the substrate are used to create the shallow trench openings 602a and 602b. As an option, a thin, thermally grown silicon oxide trench liner 603 layer may be grown on the exposed substrate and opened trenches as shown in FIG. 6B.

The opened trenches are then filled with an isolation material such as certain dielectric material. The resultant strain from the completed (filled, annealed and planarized) trench will define the net strain applied from the STI structure upon the transistor's active region. According to the present disclosure, the filled trenches should have the a material feature that would have a relatively large volume in a relative high temperature and achieve a volume shrinkage of at least 0.5% when the device is cooled down. In some cases, it is preferred that the volume shrinkage is above 5%, or even 8%. The volume shrinkage determines the net strain applied from the STI structure on the active region.

Figures 6C, 6D:
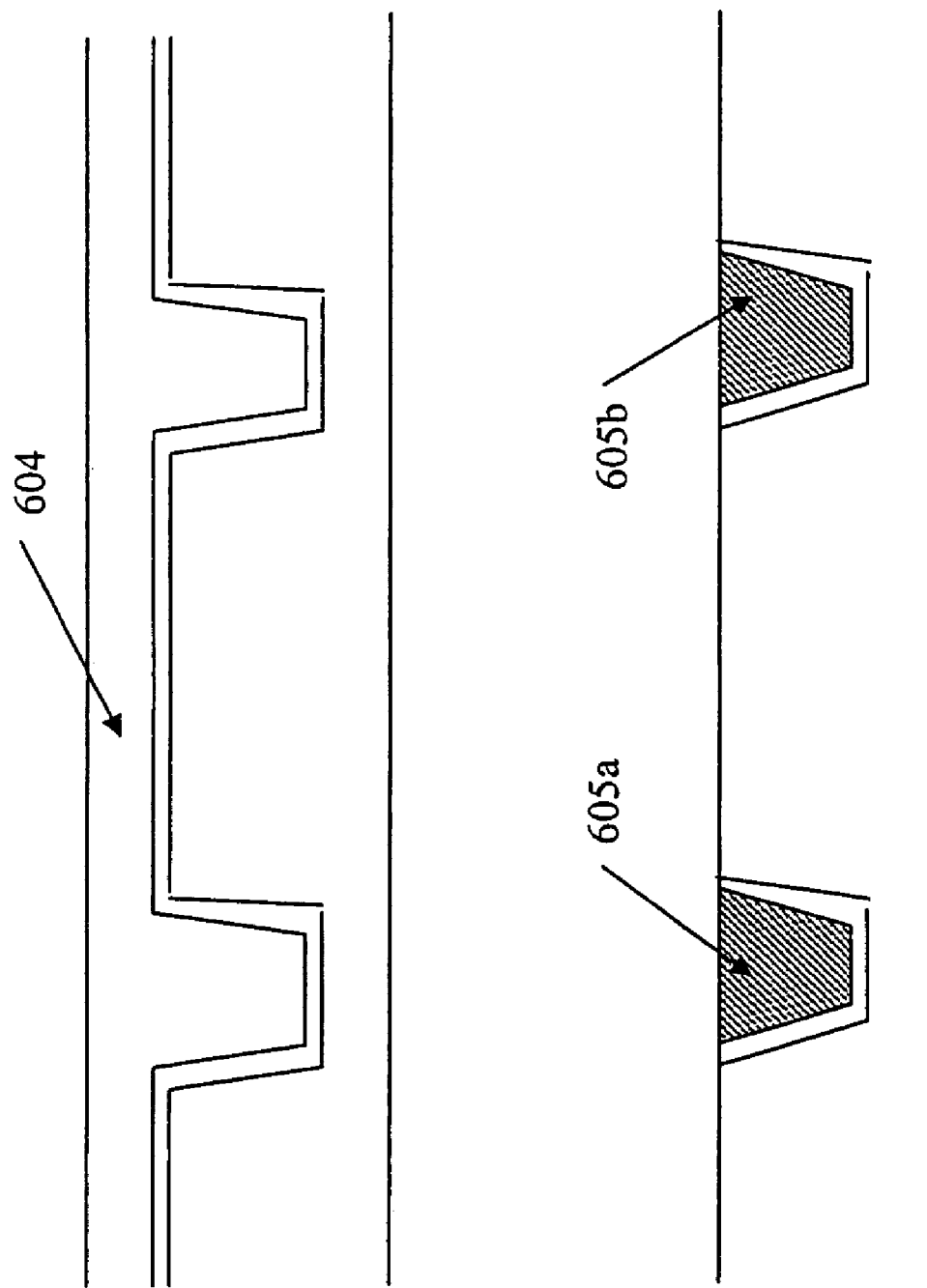

In one example, a structurally loose porous silicon oxide dielectric material is deposited onto the substrate and into the trenches by using a high-density plasma (HDP) based process. FIG. 6C shows the view of the transistor just after the HDP porous silicon oxide 604 deposition fill. The porous dielectric determines the higher level of tensile STI strain upon the transistor's active region. Porous impurities added can be big atom materials such as Ge. After the STI fill, the structures are annealed in a furnace at a high temperature, typically greater than 900 degrees Celsius, to stabilize the STI deposited dielectric. Throughout the anneal process when the temperature goes up and returns, the silicon oxide experiences volume expansion and shrinkage. The use of the very porous HDP-based silicon oxide allows a larger amount of shrinkage than that of conventional fill dielectrics.

The volume shrinkage of this porous oxide, from post deposition to post thermal anneal, will typically be greater than 0.5%. This higher level of shrinkage creates a higher level of intrinsic tensile strain in the fill material that is in turn applied upon the transistor's active region.

Other silicon oxide deposition processes may be used to produce the porous oxide which exhibits the desired 0.5% shrinkage after anneal. Processes such as low pressure chemical vapor deposition (LPCVD) or atmospheric pressure chemical vapor deposition (APCVD) utilizing tetraethyl orthosilicate (TEOS) or Silane as source material could be tuned to produce the loose structure porous silicon oxide trench fill dielectric. Other similar processes such as semi-atmosphere chemical vapor deposition (SACVD) or spin-on-glass (SOG) process can also be applied to generate desired results. The deposited material produced by such a process will have a relatively loose and large volume when the temperature is high, but will shrink when the temperature goes down as the oxide such as $SiO_2$ is formed.

Alternatively, any other dielectric material, porous or non-porous, with intrinsic tensile stress that is at least 2.0E8 dynes per square centimeter could be used. Silicon nitride, doped silicon nitride and silicon oxynitride are examples of such material. Processes for such dielectric films could be tuned to provide the desired intrinsic stress levels. These processes may be of either plasma based, LPCVD or APCVD. The above processes modulate the strain on the x-y plane that is imposed on the active region so that it can be referred to as an modulation on a net planar strain.

After the anneal process, the STI structures undergo global planarization to remove excess STI fill material such that the semiconductor substrate surface is void of any of the STI fill material leaving only the shallow trenches filled with the planarized dielectric. Chemical-mechanical polishing (CMP) with wet etch chemistries and/or dry plasma etch chemistries may be used for trench planarization. FIG. 6D illustrates a view of the substrate and STI structures after planarization. At this point, the substrate is ready for construction of the FET on the active region confined by the completed STI structure.

Figures 7A, 7B:
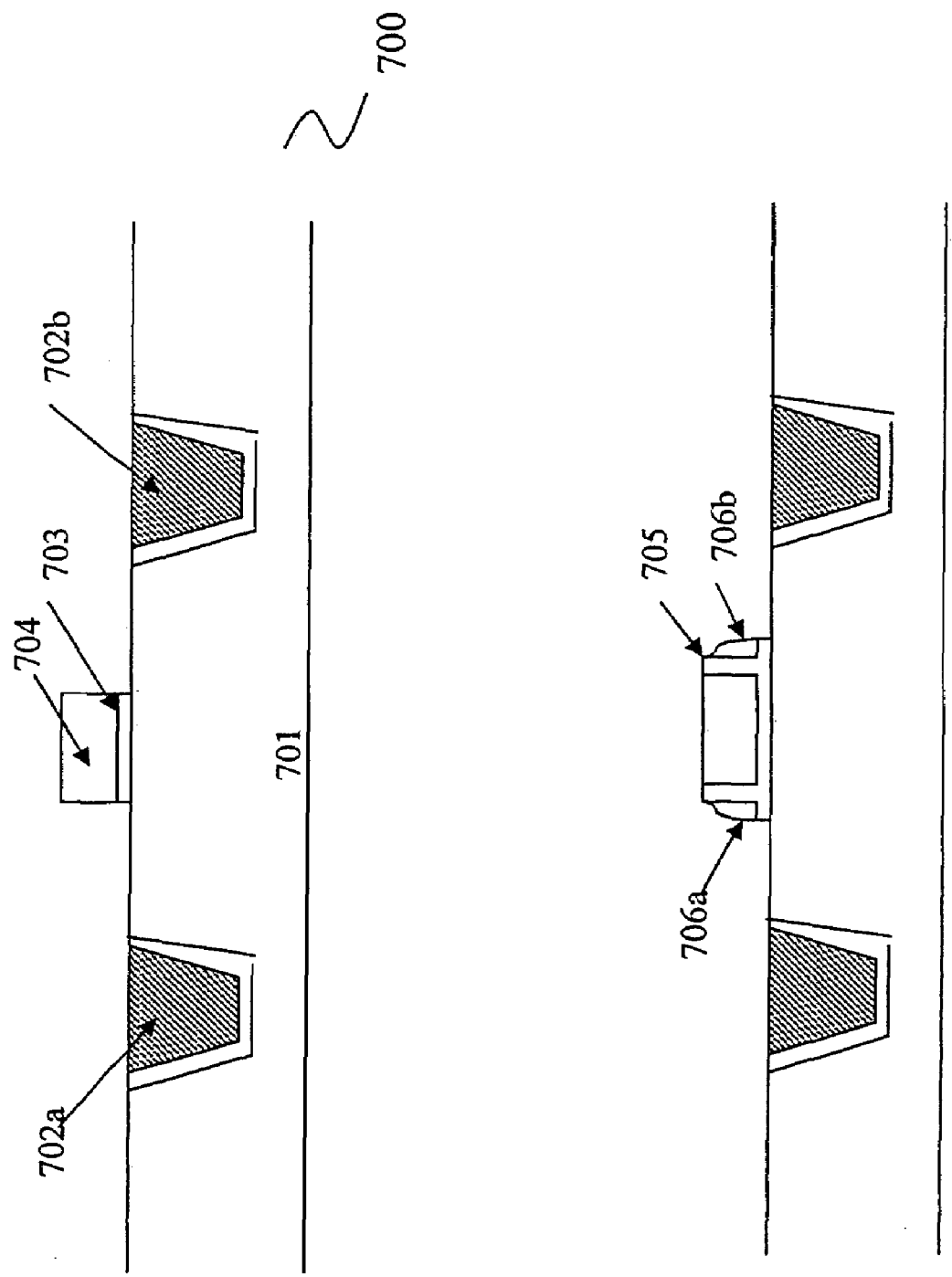
FIGS. 7A through 7D illustrate cross-sectional side views of a MOSFET through certain strain-inducing process steps after the STI structure has been created in accordance with one example of the present disclosure.

Referring now FIGS. 7A through 7D, there are shown cross-sectional side views of a field-effect transistor 700 during certain strain-inducing process steps after the creation of the STI structure. To complement the x-y biaxial stress modulation methodology as previously described, stress modulation of certain other process may provide additional transistor enhancements gained from the third strain axis. FIG. 7A illustrates a semiconductor silicon substrate 701 with the completed STI structures 702a and 702b fabricated. The FET's gate, comprising of gate oxide 703 and gate electrode 704, is shown. The transistor's sidewall liner layer is subsequently deposited onto the transistor followed by deposition of the spacer layer.

The preferential specification of a high intrinsic tensile film to be used for a spacer layer 706a-b will induce a desirable high tensile strain upon the gate channel. The spacer layer 706a-b is typically comprised of silicon nitride as in this embodiment, but may be of any dielectric material. In this example, the intrinsic stress level of the spacer level is greater than 1.20E8 dynes per square centimeter. The liner layer 705 is typically comprised of silicon oxide, but may also be of any dielectric material. After deposition of the transistor sidewall liner and spacer films, the two layers are then masked with a photoresist pattern and etched to form the spacer structures situated directly adjacent to the side walls of the gate region. FIG. 7B illustrates the sidewall liner 705 and sidewall spacers 706a and 706b after completion of the masking and etch processes.

Figure 7C:
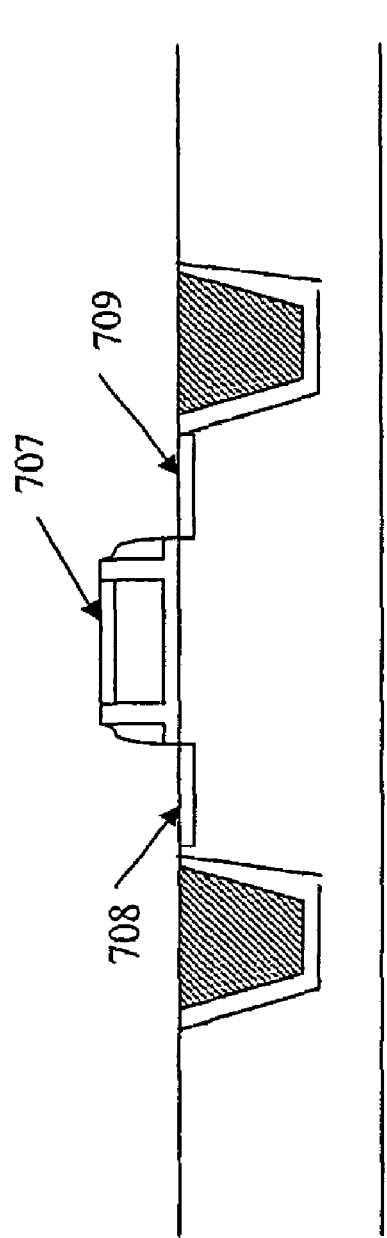

FIG. 7C illustrates the transistor with the completed silicide regions for the source 708, drain 709 and gate 707. After the spacers 706a-b are created, the substrate source and drain regions 708-709 of the transistor are fabricated. These regions are subsequently silicided with metal for resistance reduction and subsequent contact connections. Refractory metals are typically used as the source metals for the silicidation processes. The metal material may be of a single layer, single element, doped metal, or a composite stack of different metals. The complete silicidation process is performed in several steps. The metal layer(s) is first deposited onto the transistor. The metal silicide is formed and then annealed under high temperatures usually in either a furnace or a rapid thermal process chamber. Non-reacted metals are then subsequently etched off the transistor and surrounding areas using a wet etch chemistry leaving only the metal silicided layers.

The volume shrinkage of the metal (or composite metal layers), before silicidation and after anneal, will be at least 10% to provide an intrinsic stress of the formed and annealed silicided layers in the source and drain regions (not shown) to be greater than 2.0E8 dynes per square centimeter. The thermal expansion mismatch between the source and drain substrate regions and the source and drain metal silicided regions will be greater than 0.5% after the silicide anneal operation. By using a process that provides the desired intrinsic stress of the deposited metal(s), the level of tensile strain applied to the gate channel can be modulated to the required levels for enhancement of the transistor Id performance.

Figure 7D:
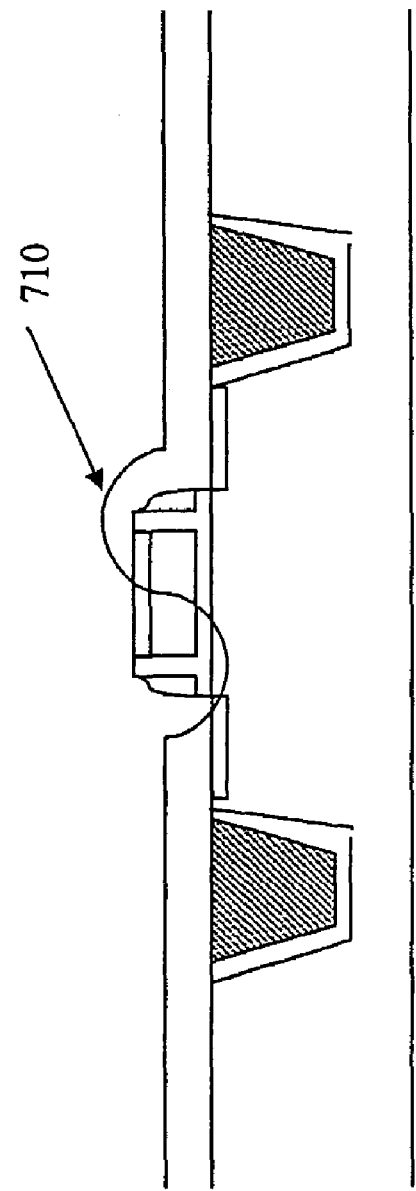

The transistor as illustrated in FIG. 7D shows the contact etch stop layer (CES) 710 deposited on top of the entire transistor just prior to the pattern masking and etching of the layer to create contact openings. The layer is created by using a chemical vapor deposition process. The CES layer has its intrinsic stress modified to impose a stress that influences a net strain on the active region. For example, as with the methodology used for the previously discussed embodiments of this disclosure, the stress in the z direction caused by this CES layer could be modulated to change the net strain applied to the transistor's active region and gate channel. Adjustment to the layer's deposition process to modify intrinsic stress and/or the use of added operations, such as Germanium ion implantation, to modify the layer's intrinsic strain in the vertical z direction that could be used to modulate the net strain upon the transistors' active regions.

The spacers and the CES layer modulate, to different degrees, the strain in a vertical direction perpendicular to the x-y plane, which can be referred to as a net vertical strain. The combination of the vertical and planar net strains is the overall net strain, which ultimately impacts on the drive current. It is understood that the net strain modulation for the transistors may be accomplished with a selective design methodology for the strain-inducing processes. Through specification and change to the intrinsic stress levels of certain unit processes, the cumulative effects of the modulated strain modifications may be tailored to achieve the desired magnitudes of strain change in the desired various directional axis to obtain the required amount and levels of enhanced transistor performance.

Figure 8:
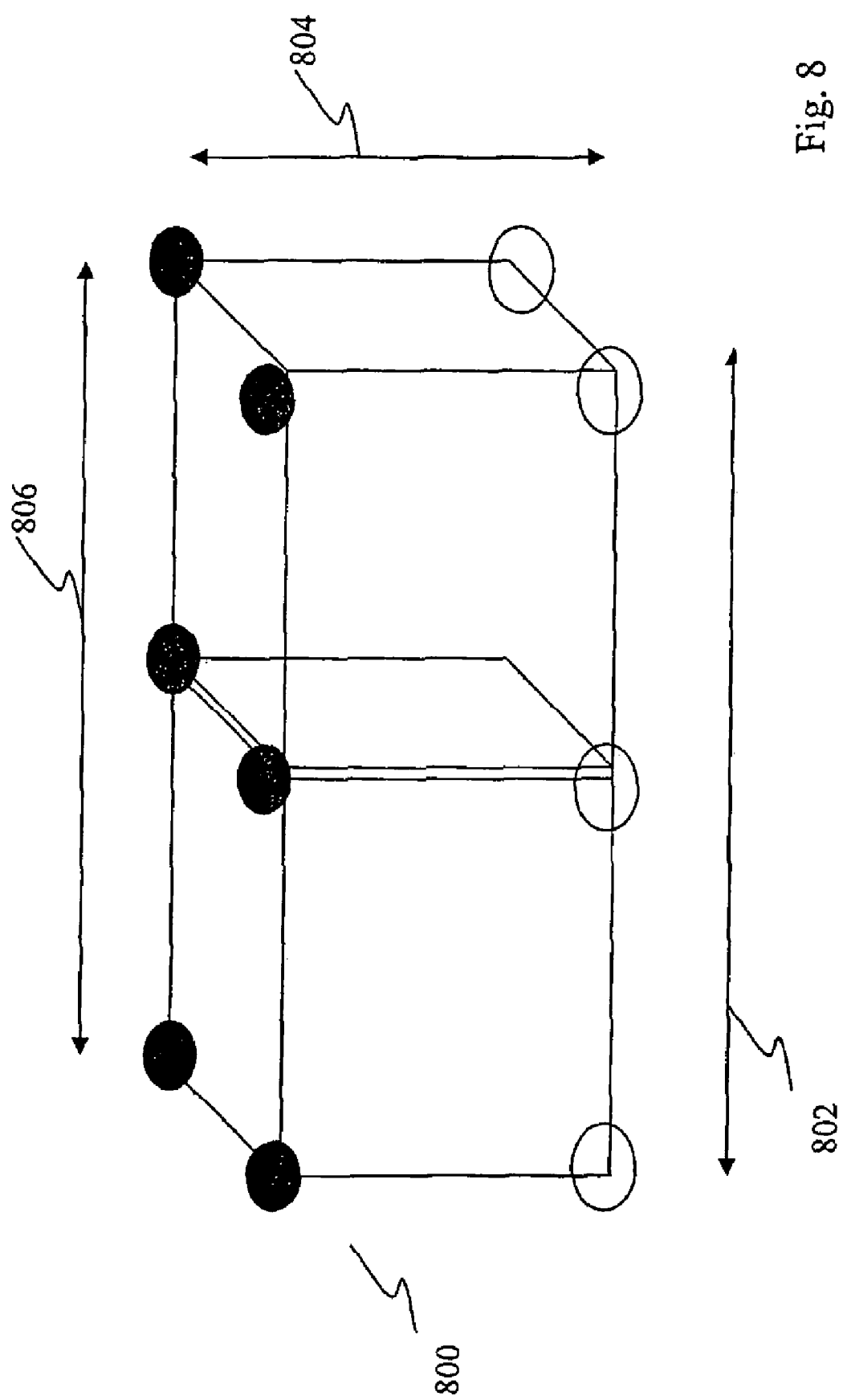
FIG. 8 illustrates a sample material showing its atomic structure in accordance with the present disclosure.

FIG. 8 illustrates a sample material showing an atomic structure 800 of the active region for making a semiconductor device with an improved drive current. Other than controlling the stress as described above by using various mechanisms, the stress can be also controlled within the active region by controlling the atomic distances in different directions. It is understood that whether it is an N type or P type device, there is a carrier flow in the active region either through hole or electron movements. As shown in FIG. 8, the carrier flow is deemed to have a direction 802. In order to have the improved drive current through stress control, a P type semiconductor device with an improved drive current has its atoms in the active region having a larger atomic distance in the direction parallel to the width of the active region 804 than that in the direction parallel to the length of the active region 806 or parallel to the carrier flow. On the contrary, an N type semiconductor device is preferred to have atoms in the active region have a larger atomic distance in the direction parallel to the carrier flow or the length of the active region than that in the direction perpendicular to the carrier flow or parallel to the width of the active region. There may be various ways to determine the atomic distance. For example, the atomic distance may be determined by sampling a number of lattice images in a high resolution Transparent Electronic Microscope or through measurements of diffraction patterns.

The examples of the present disclosure may be practiced upon any field-effect transistor, which is fabricated upon a semiconductor substrate with processes that use deposited or grown stress-inducing films applied to the transistors.

Accordingly, it is seen from the above that the device structure and the methods for making same according to the present disclosure provide viable solutions to the problems of improving carrier mobility and drive current (Id) of CMOS devices, and even simultaneously for both NMOS and PMOS type transistors in CMOS circuits. It is also noted that the present disclosure provides a solution for the further shrinkage of FET sizes and densities that are manufactured using conventional process methodologies. It is also seen that the present disclosure provides simplified methods for the modification of the net mechanical stress and strain induced by the shape and property of the transistors' shallow trench structures, spacer layer, silicided layers and CES layers upon the gate channel. Devices manufactured in accordance with the present disclosure are easily incorporated in currently existing systems.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A semiconductor device with an improved drive current comprising:
   an active region;
   one or more isolation regions filled with an predetermined isolation material surrounding the active region;
   source and drain regions built on the active region;
   a metal layer over the source and drain region to form a silicide; and
   a gate electrode over the active region;
   at least one dielectric spacer adjacent to the gate electrode; and
   a contact etch stop layer over the device,
   wherein atoms in the active region have a larger atomic distance in the direction parallel to a length of the active region than that in the direction parallel to a width of the active region, the length and width being of different dimensions and the isolation material is porous and is formed of Ge.

* * * * *